US008623738B2

(12) United States Patent
Shih et al.

(10) Patent No.: US 8,623,738 B2
(45) Date of Patent: Jan. 7, 2014

(54) CAPACITOR STRUCTURE AND FABRICATION METHOD THEREOF

(75) Inventors: Tah-Te Shih, Taipei (TW); Tsung-Cheng Yang, Taichung (TW)

(73) Assignee: Inotera Memories, Inc., Hwa-Ya Technology Park Kueishan, Taoyuan (TW)

(*) Notice: Subject to any disclaimer, the term of this patent is extended or adjusted under 35 U.S.C. 154(b) by 274 days.

(21) Appl. No.: 13/085,493

(22) Filed: Apr. 13, 2011

(65) Prior Publication Data

US 2012/0193757 A1   Aug. 2, 2012

(30) Foreign Application Priority Data

Jan. 31, 2011   (TW) .............................. 100103623 A

(51) Int. Cl.
*H01L 21/20* (2006.01)

(52) U.S. Cl.
USPC .................... 438/396; 257/532; 257/E21.008

(58) Field of Classification Search
USPC ........... 257/532, E29.343, E21.008; 438/397, 438/396
See application file for complete search history.

(56) References Cited

U.S. PATENT DOCUMENTS

| 5,753,547 | A  | * | 5/1998  | Ying .............................. 438/253 |
| 6,214,659 | B1 |   | 4/2001  | Liao |
| 7,029,970 | B2 |   | 4/2006  | Ahn |
| 7,208,790 | B2 | * | 4/2007  | Arai et al. ...................... 257/296 |
| 7,468,306 | B2 | * | 12/2008 | Thies et al. .................... 438/396 |
| 2005/0208727 | A1 | * | 9/2005 | Lin et al. ........................ 438/386 |
| 2006/0267139 | A1 |  | 11/2006 | Thies |
| 2007/0035984 | A1 |  | 2/2007  | Arai |
| 2009/0267198 | A1 | * | 10/2009 | Tada et al. ..................... 257/635 |

FOREIGN PATENT DOCUMENTS

TW          379447          1/2000

* cited by examiner

*Primary Examiner* — Wael Fahmy
*Assistant Examiner* — Sarah Salerno
(74) *Attorney, Agent, or Firm* — Winston Hsu; Scott Margo

(57) ABSTRACT

A DRAM capacitor structure is disposed on the interior surface of a vertical hollow cylinder of a support structure overlying a semiconductor substrate. The support structure further includes a horizontal supporting layer that is integrally connected with the vertical hollow cylinder. A fabrication method for forming the DRAM capacitor structure is also provided.

9 Claims, 12 Drawing Sheets

CAPACITOR STRUCTURE AND FABRICATION METHOD THEREOF

BACKGROUND OF THE INVENTION

1. Field of the Invention

The present invention relates to a capacitor structure and a fabrication method thereof, and more particularly, to a dynamic random access memory stack capacitor structure having a particular supporting structure and a fabrication method thereof.

2. Description of the Prior Art

A dynamic random access memory (DRAM) device is made up of many memory cells. Generally, the memory cell is a semiconductor memory device with an access transistor and a storage capacitor. Each memory cell can store one bit of data by storing electric charges in the storage capacitor.

In general, the storage capacitor contains an upper electrode, a dielectric layer, and a lower electrode. The storage capability of the storage capacitor is proportional to an overlapping area between the upper/lower electrodes and the dielectric layer. Since modern electrical products are developed with minimized sizes thereof, the area of each memory cell tends to be reduced, so that the DRAM device can be designed with high integrated density. However, the reduction of the area of each memory cell leads to lower storage capability of the memory cell, which requires high refresh frequency and therefore affects the performance of the DRAM device. Currently, two methods are provided to increase storage capability of the storage capacitor. A method is proposed to use a material with higher dielectric constant for the dielectric layer, and the other method is proposed to increase the overlapping area between the upper/lower electrodes and the dielectric layer.

Several methods of increasing the area of the capacitor electrode have been proposed in the prior art. For example, crown-type stacked capacitors can be used to increase the total surface area of the capacitor electrode owing to its sidewall structures. According to the prior art, lithography and etching process is performed to form a plurality of crown-type stacked capacitors, and each crown-type stacked capacitor is supported by a supporting structure. However, the existing supporting structures are only formed at a top of each crown-type stacked capacitor and tend to be damaged, which may cause a reduction of product yield. Therefore, a capacitor structure having a particular supporting structure and a fabrication method thereof are required.

SUMMARY OF THE INVENTION

It is therefore one of the objectives of the present invention is to provide a capacitor structure with a particular supporting structure and a fabrication method thereof, in which storage capacitors can be well supported.

In accordance with the present invention, a capacitor structure is disposed on an interior surface of a vertical hollow cylinder of a supporting structure. The supporting structure is disposed on a substrate, and the supporting structure further includes a horizontal supporting layer connected to the vertical hollow cylinder.

In accordance with the present invention, a fabrication method of the capacitor structure is provided as follows. A substrate is provided, and at least one capacitor disposing region is defined on the substrate. A supporting region is defined on a portion of the substrate where no capacitor disposing region is located. Then, a supporting structure is formed on the substrate, where the supporting structure includes at least one vertical hollow cylinder and a horizontal supporting layer connected to the vertical hollow cylinder. Each vertical hollow cylinder surrounds the corresponding capacitor disposing region, and the supporting layer is disposed on the substrate within the supporting region. Finally, a capacitor structure is formed in the vertical hollow cylinder.

In the present invention, the storage capacitor is not only disposed on an exterior surface of the capacitor structure, but also entirely supports sidewalls of the capacitor structure. Thus, product yield of the storage capacitor can be promoted.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention for one skilled in the art, preferred embodiments will be detailed as follows. The preferred embodiments of the present invention are illustrated in the accompanying drawings with numbered elements to elaborate the contents and effects to be achieved.

Figure 1:
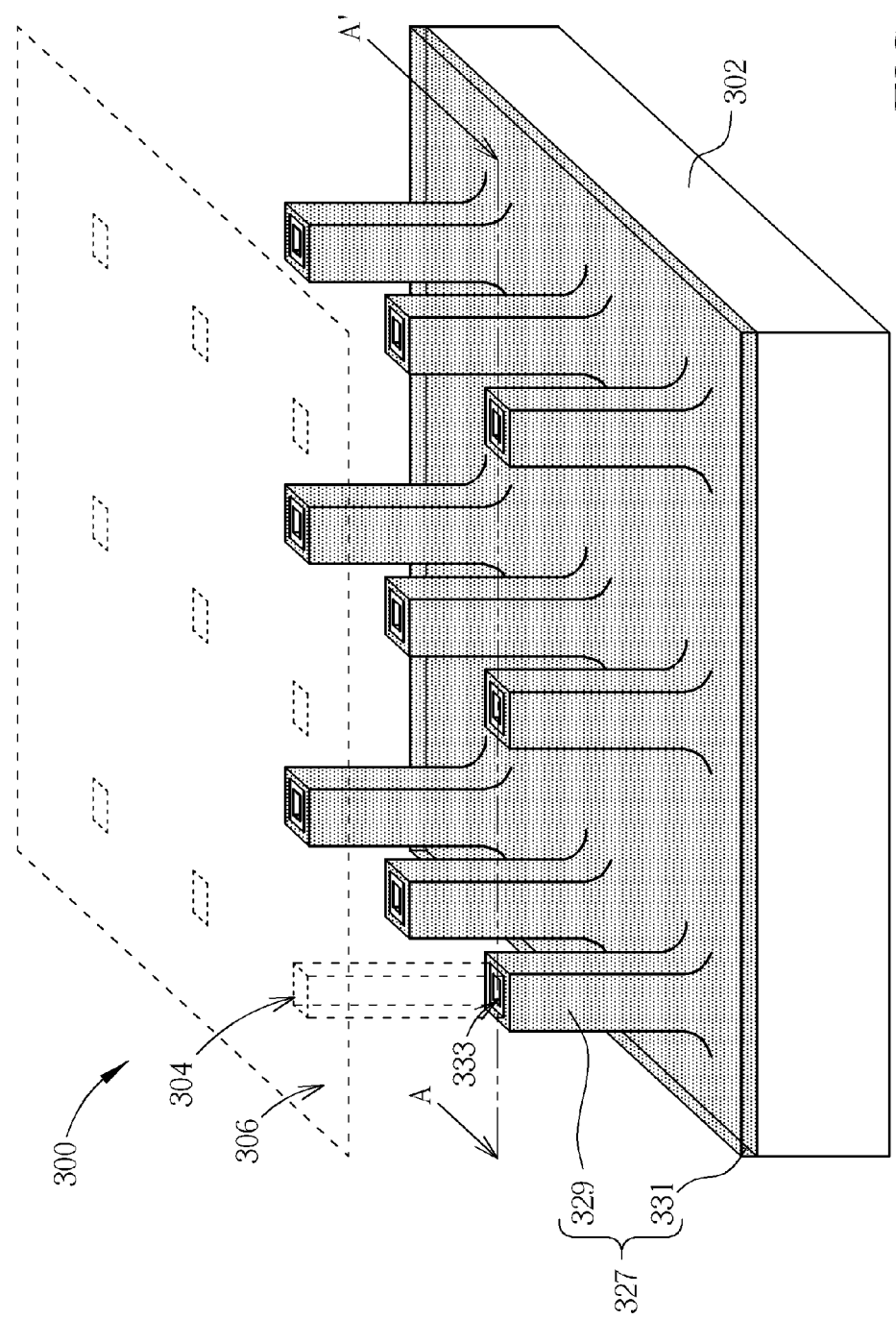
FIG. 1 and FIG. 2 are schematic diagrams illustrating a storage capacitor of the present invention.

Please refer to FIG. 1, which schematically illustrates a capacitor structure of the present invention. As shown in FIG. 1, a storage capacitor 300 of the present invention includes a substrate 302, a supporting structure 327, and at least a capacitor structure 333. The substrate 302 has a plurality of capacitor disposing regions 304 defined thereon, and the capacitor disposing regions 304 are preferably rectangles and arranged in an array. The capacitor disposing regions 304 also can be designed to be other shapes, such as circular shape, based on different requirements. A supporting region 306 is defined on a portion of the substrate 302 where no capacitor disposing region 304 is located. The supporting structure 327 is formed on the substrate 302 within the supporting region 306, and the supporting structure 327 includes a plurality of vertical hollow cylinders 329 and a horizontal supporting layer 331 connected to a bottom of each vertical hollow cylinder 329. Each vertical hollow cylinder 329 is vertically extended from the horizontal supporting layer 331, and a central axis of each vertical hollow cylinder 329 is substantially perpendicular to a horizontal plane of the substrate 302. Also, each vertical hollow cylinder 329 surrounds the corresponding capacitor disposing region 304. The capacitor structure 333 is formed on the substrate 302 within each capacitor disposing region 304, and is correspondingly disposed on an interior surface of each vertical hollow cylinder 329. In other words, the vertical hollow cylinder 329 surrounds each capacitor structure 333 so as to support each capacitor structure 333.

Figure 2:
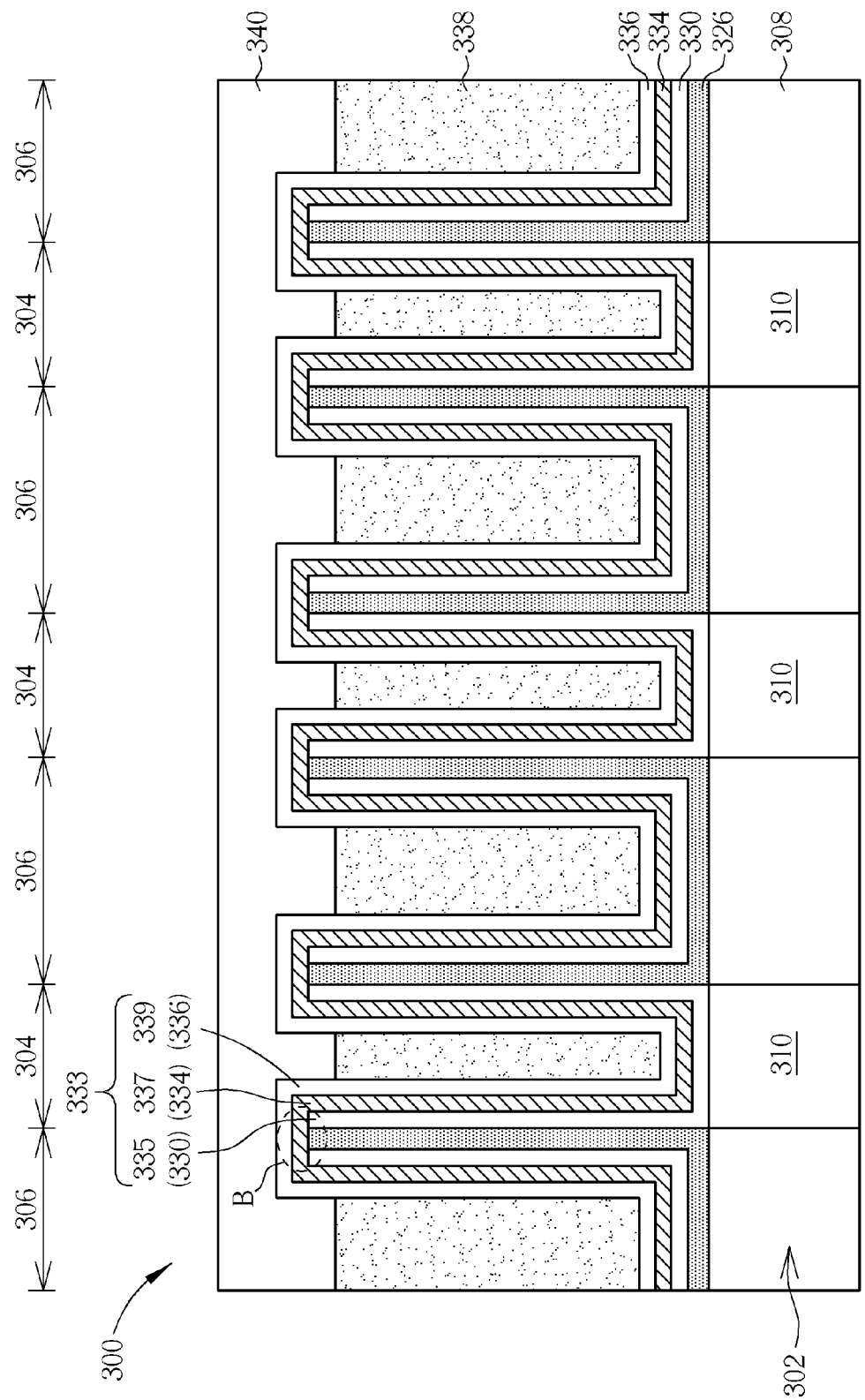

Please refer to FIG. 2, which schematically illustrates a cross-sectional view of the capacitor structure along line AA' shown in FIG. 1. As shown in FIG. 2, the storage capacitor 300 of the present invention further includes a first conductive layer 330, a dielectric layer 334, and a second conductive layer 336 disposed on the substrate 302 (for the sake of clear illustration, the first conductive layer 330, the dielectric layer 334, and the second conductive layer 336 are not shown in FIG. 1). The first conductive layer 330, the dielectric layer 334, and the second conductive layer 336 located in each capacitor disposing region 304 constitute the capacitor structure 333. The first conductive layer 330 serves as a first capacitor electrode 335, the dielectric layer 334 serves as a capacitor dielectric layer 337, and the second conductive layer 336 serves as a second capacitor electrode 339. It is noted that the first conductive layer 330 located on the intersectional regions (region B shown in FIG. 2) between each capacitor disposing regions 304 and the supporting region 306 is discontinuous without linkage, so that the first conductive layer 330 located in each capacitor disposing regions 304 is not electrically connected to the first conductive layer 330 located in the supporting region 306. In accordance with an embodiment of the present invention, a low-k dielectric layer 338 and a metal layer 340 are disposed on the second conductive layer 336 (for sake of clear illustration, the low-k dielectric layer 338 and the metal layer 340 are not shown in FIG. 1). A preferred thickness of the low-k dielectric layer 338 is substantially smaller than a height of the second conductive layer 336, so that the metal layer 340 can be electrically connected to the second conductive layer 336. In an embodiment of the present invention, a plurality of storage node contacts 310 are disposed in the substrate 302. Each storage node contact 310 is extended downward so as to electrically connect to an access transistor (not shown), and extended upward so as to electrically connect to each capacitor structure 333. Accordingly, different capacitor structures 333 can be accessed by different access transistors and the storage node contacts 310 electrically connected thereto.

Figure 3:
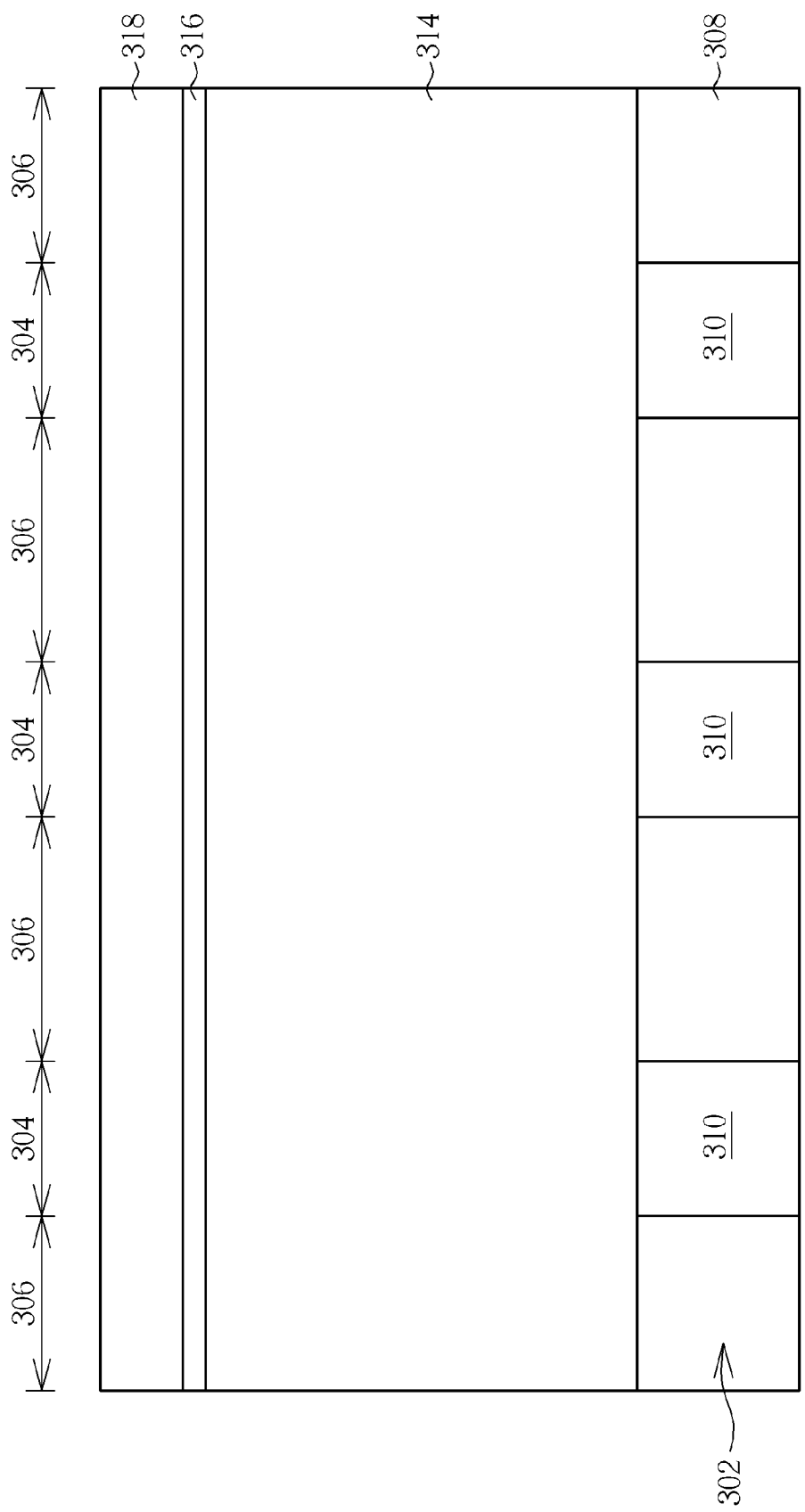
FIG. 3 through FIG. 12 are schematic diagrams illustrating fabrication steps of the capacitor structure of the present invention.

Please refer to FIG. 3 through FIG. 12, which schematically illustrate fabrication steps of the capacitor structure of the present invention respectively. As shown in FIG. 3, a substrate 302 is provided. The substrate 302 has a plurality of capacitor disposing regions 304 defined thereon. The capacitor disposing regions 304 are preferably rectangles and arranged in an array. The capacitor disposing regions 304 also can be designed with other shapes, such as circle shape, based on different requirements. The supporting region 306 is defined on a portion of the substrate 302 where no capacitor disposing region 304 is located (refer to FIG. 1). Then, a plurality of access transistors (not shown) are formed in the substrate 302. The access transistors can be different types of access transistors having horizontal gates, notch gates or vertical gates, and the manufacturing method is well known to those skilled in the prior art, thus is not redundantly described. Next, an insulating layer 308 is formed above the access transistors, and the insulating layer 308 has a plurality of storage node contacts 310 (also called landing pads) electrically connected to the access transistors (not shown). The storage node contacts 310 correspond to each capacitor disposing region 304 on which the capacitor structure 333 is formed later. After that, a first sacrificial layer 314, a shielding layer 316, and a photoresist layer 318 are formed on the insulating layer 308 in sequence. In the preferred embodiment of the present invention, the first sacrificial layer 314 can be a doped oxide layer made of, for example, borophosphosilicate glass (PSG), the shielding layer 316 can be a silicon nitride layer, and the photoresist layer 318 can include negative photoresist material.

Figure 4:
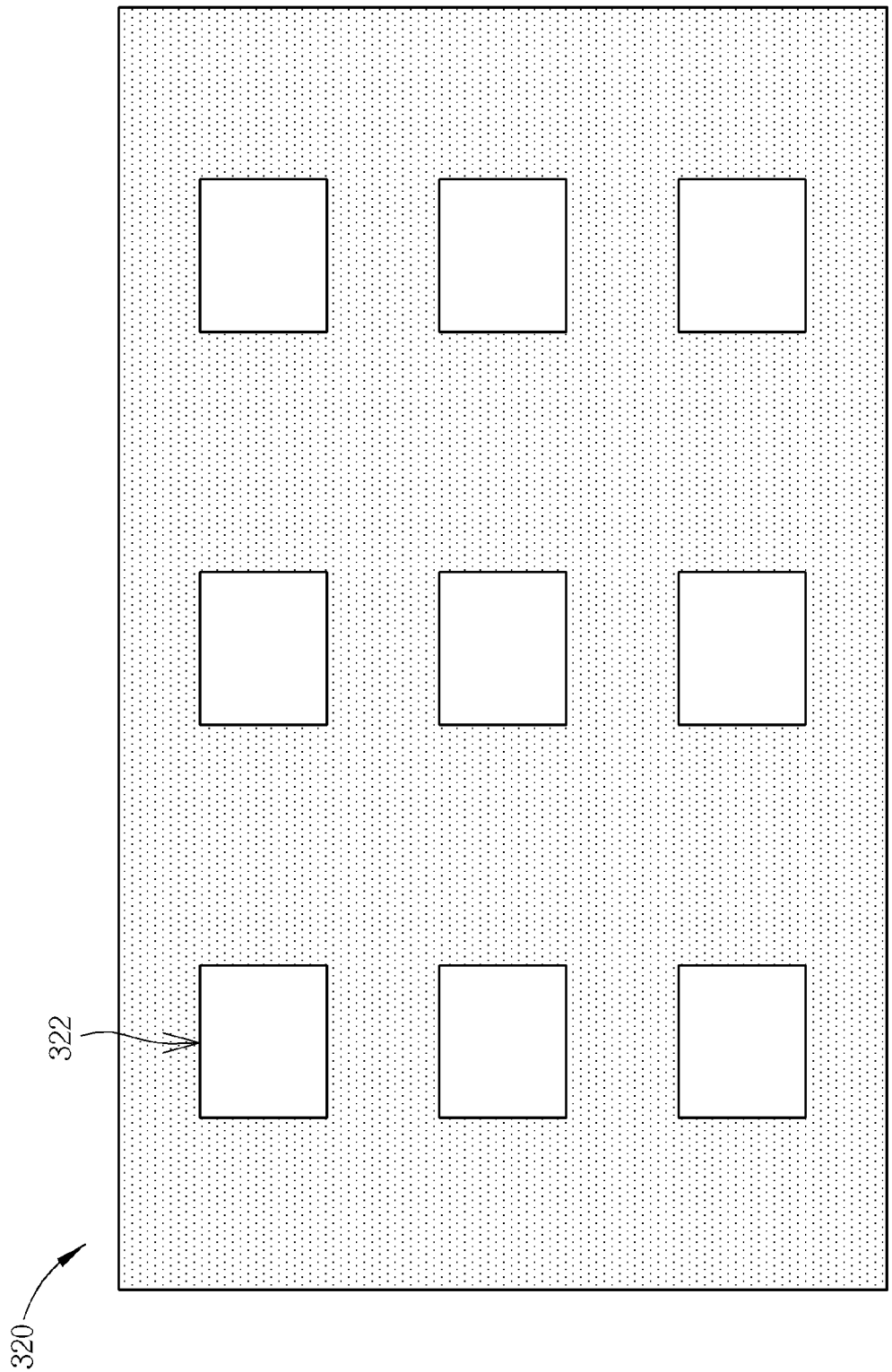
Figure 5:
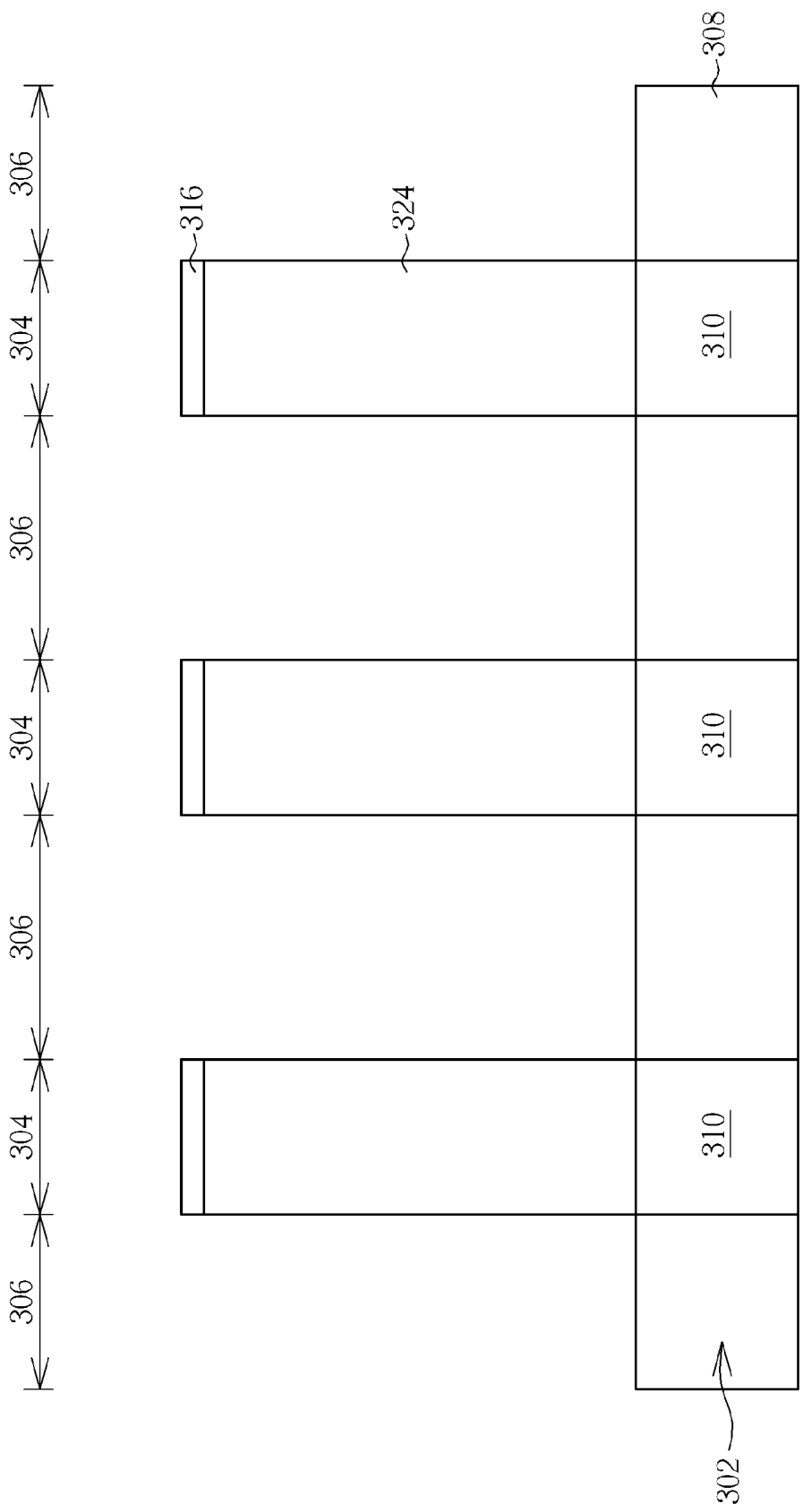

Afterward, a lithography process is performed on the photoresist layer 318 by a mask 320. Please refer to FIG. 4, which illustrates the mask 320 of the present invention. As shown in FIG. 4, the mask 320 includes a plurality of light transmissive regions 322. In the lithography process, the light transmissive regions 322 are orientated corresponding to each capacitor disposing region 304, so that the photoresist layer 318 located in each capacitor disposing region 304 is exposed by light, and the photoresist layer 318 located in the supporting region 306 is not exposed by the light. Next, a developing process is performed to remove the photoresist layer 318 located in the supporting region 306. After being patternized, the photoresist layer 318 is utilized as a mask to remove the shielding layer 316 located in the supporting region 306. As shown in FIG. 5, after being patternized, the shielding layer 316 serves as another mask to remove the first sacrificial layer 314 located in the supporting region 306 and to form a sacrificial cylinder 324 in each capacitor disposing region 304. Then, the shielding layer 316 is removed.

Figure 6:
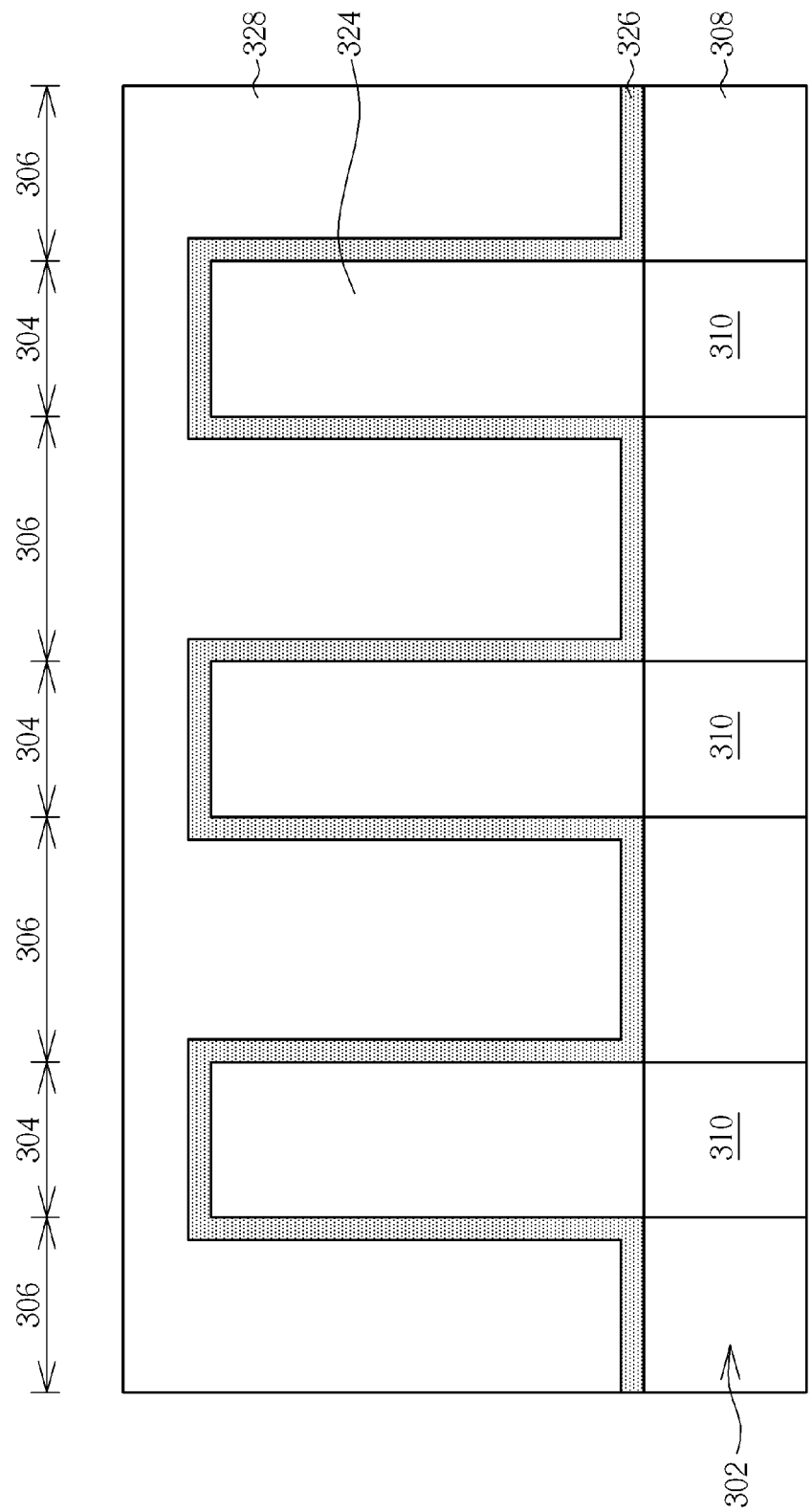

As shown in FIG. 6, a material layer 326 and a second sacrificial layer 328 are disposed throughout the substrate 308. The material layer 326 is formed along the surface of the substrate 302 within the supporting region 306 and the exterior surface of the sacrificial cylinder 324 located in each capacitor disposing region 304. The second sacrificial layer 328 is formed on the material layer 326. In this preferred embodiment of the present invention, the material layer 326 is a carbon layer with electrical neutrality, which provides preferable hardness and rigidity. The second sacrificial layer 328 is a material layer, such as a spin-on glass (SOG) layer, a bottom anti-reflective coating (BARC) layer or a photoresist layer, with good gap filling ability, but is not limited thereto.

Figure 7:
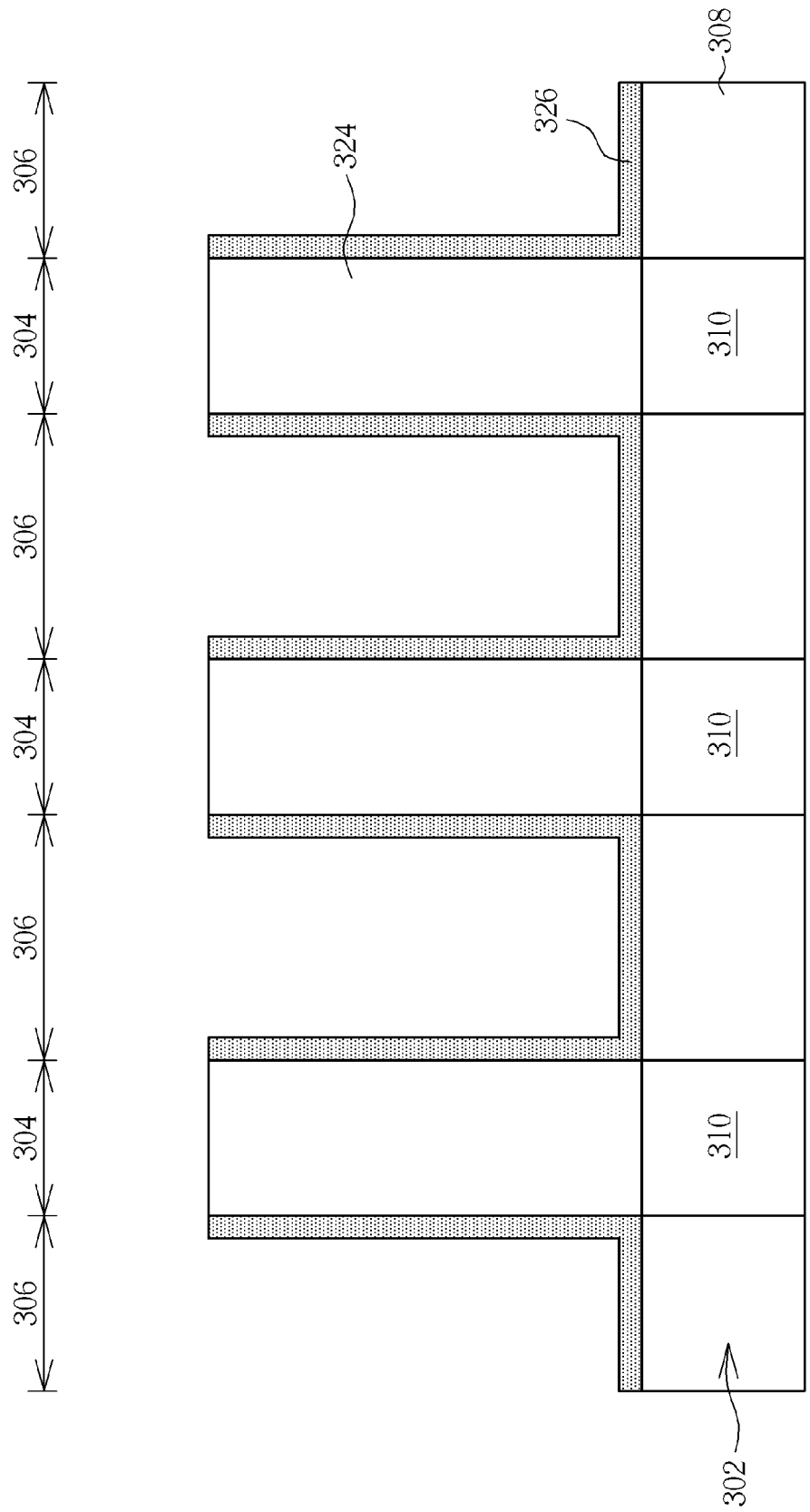
Figure 8:
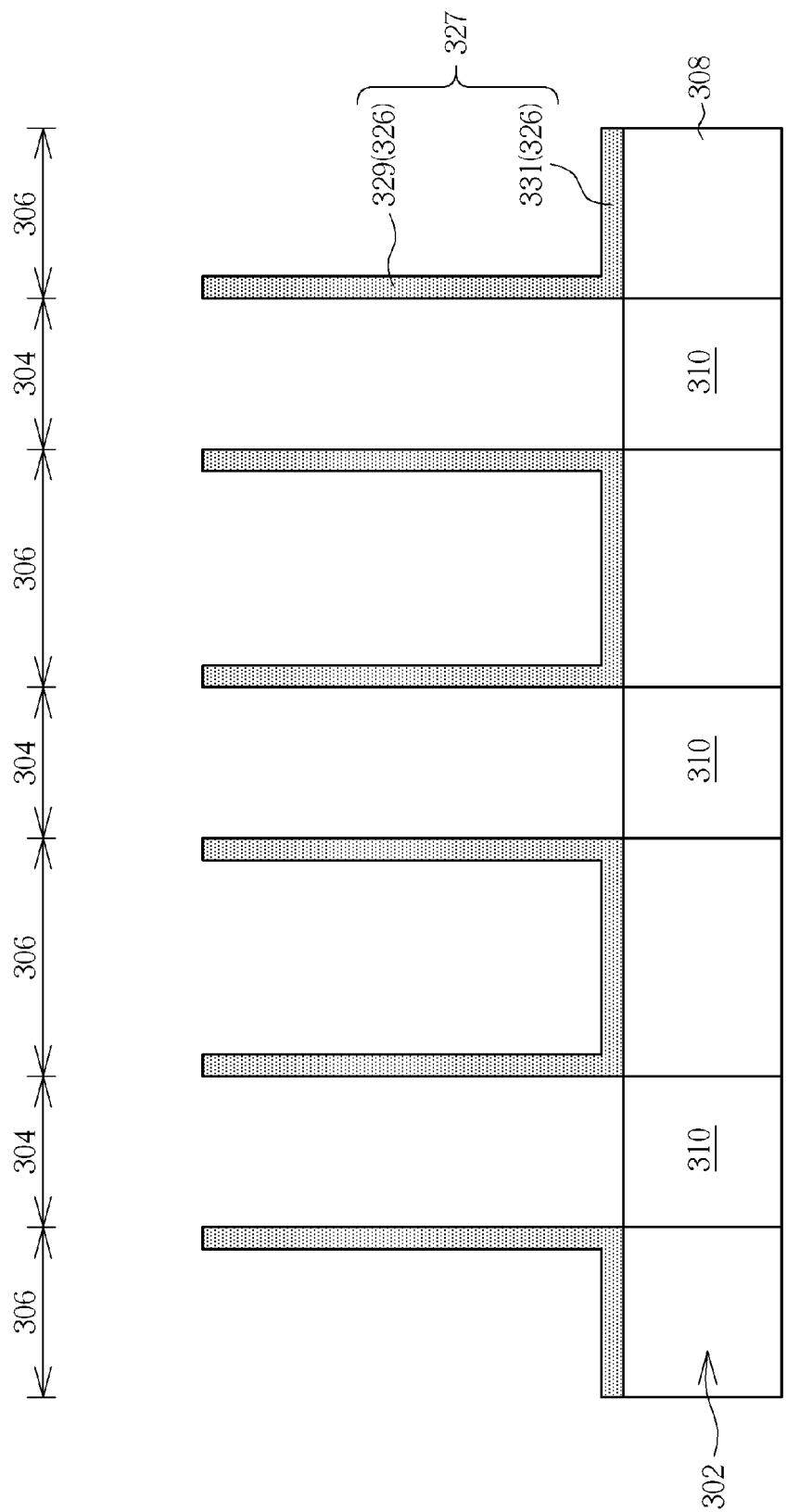

As shown in FIG. 7, a planarization process, such as an etch back process, is performed to remove the material layer 326 located in each capacitor disposing region 304, i.e. the material layer 326 located at a top of each sacrificial cylinder 324. Then, the second sacrificial layer 328 is completely removed. As shown in FIG. 8, a wet etching process is performed to remove the sacrificial cylinder 324 located in each capacitor disposing region 304. Thus, the material layer 326 located on the substrate 302 becomes a supporting structure 327. The supporting structure 327 is formed in each supporting region 306, and includes a plurality of vertical hollow cylinders 329 and a horizontal supporting layer 331 connected to each vertical hollow cylinder 329 (please refer to FIG. 1). Each vertical hollow cylinder 329 is vertically extended from the horizontal supporting layer 331 and correspondingly surrounds each capacitor disposing region 304.

Figure 9:
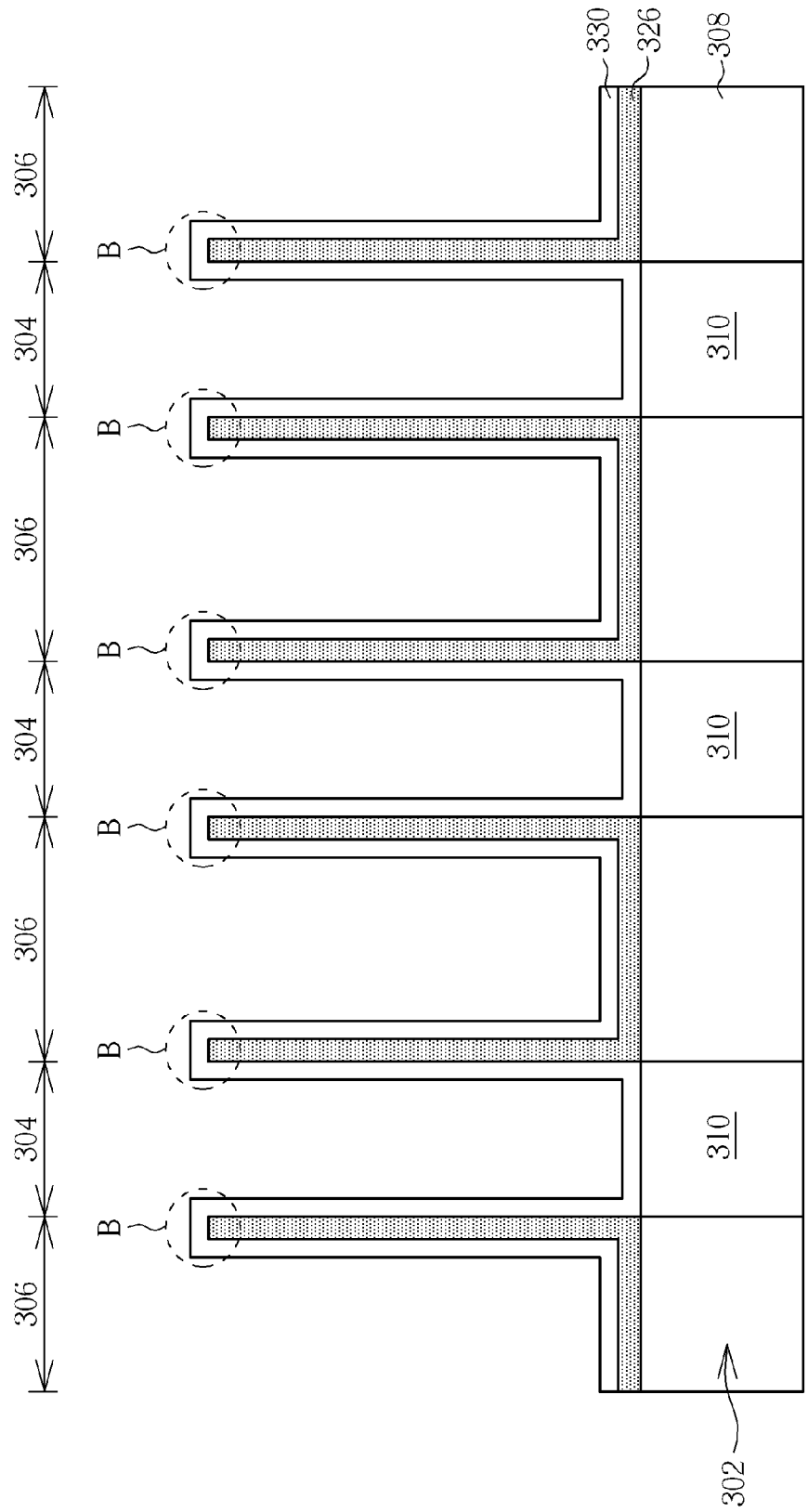

As shown in FIG. 9, a first conductive layer 330 is disposed throughout the substrate 302. The first conductive layer 330 is formed along the surface of the material layer 326 within the supporting region 306 and the capacitor disposing region 304 and formed on the surface of the substrate 302 within the capacitor disposing regions 304. The first conductive layer 330 can be made of varieties of conductive materials, such as titanium, gold, silver, copper, aluminum, molybdenum, tantalum, cadmium, nitride thereof, oxide thereof, alloys thereof or compounds thereof, but is not limited thereto.

Figure 10:
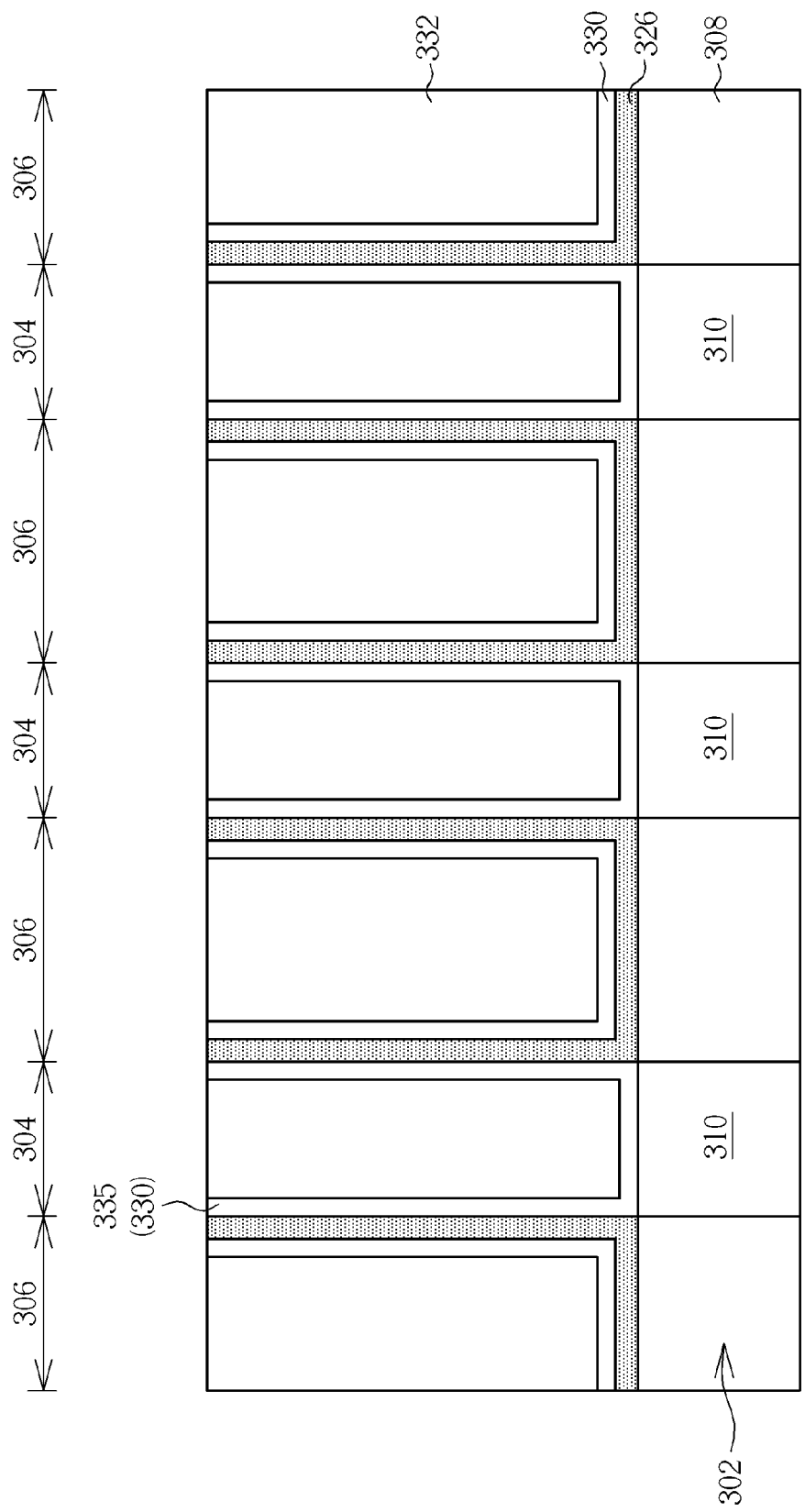

As shown in FIG. 10, a third sacrificial layer 332 is disposed throughout the substrate 302, and the third sacrificial layer 332 is formed on the first conductive layer 330 disposed in the capacitor disposing regions 304 and the supporting region 306. In addition, the third sacrificial layer 332 is a material layer, such as a spin-on glass (SOG) layer, a bottom anti-reflective coating (BARC) layer or a photoresist layer, with good gap filling ability, but is not limited thereto. Then, a planarization process, such as an etch back process, is performed to remove at least the first conductive layer 330 located on the intersectional regions between each capacitor disposing region 304 and the supporting region 306, i.e. the first conductive layer 330 located in region B shown in FIG. 9. Thus, the first conductive layer 330 located in each capacitor disposing region 304 and that located in the supporting region 306 are not electrically connected to each other. As a result, the first conductive layer 330 located in each capacitor disposing region 304 can serve as the first capacitor electrode 335 of each capacitor structure 333, and the first capacitor electrode 335 is a crown-type electrode.

Figure 11:
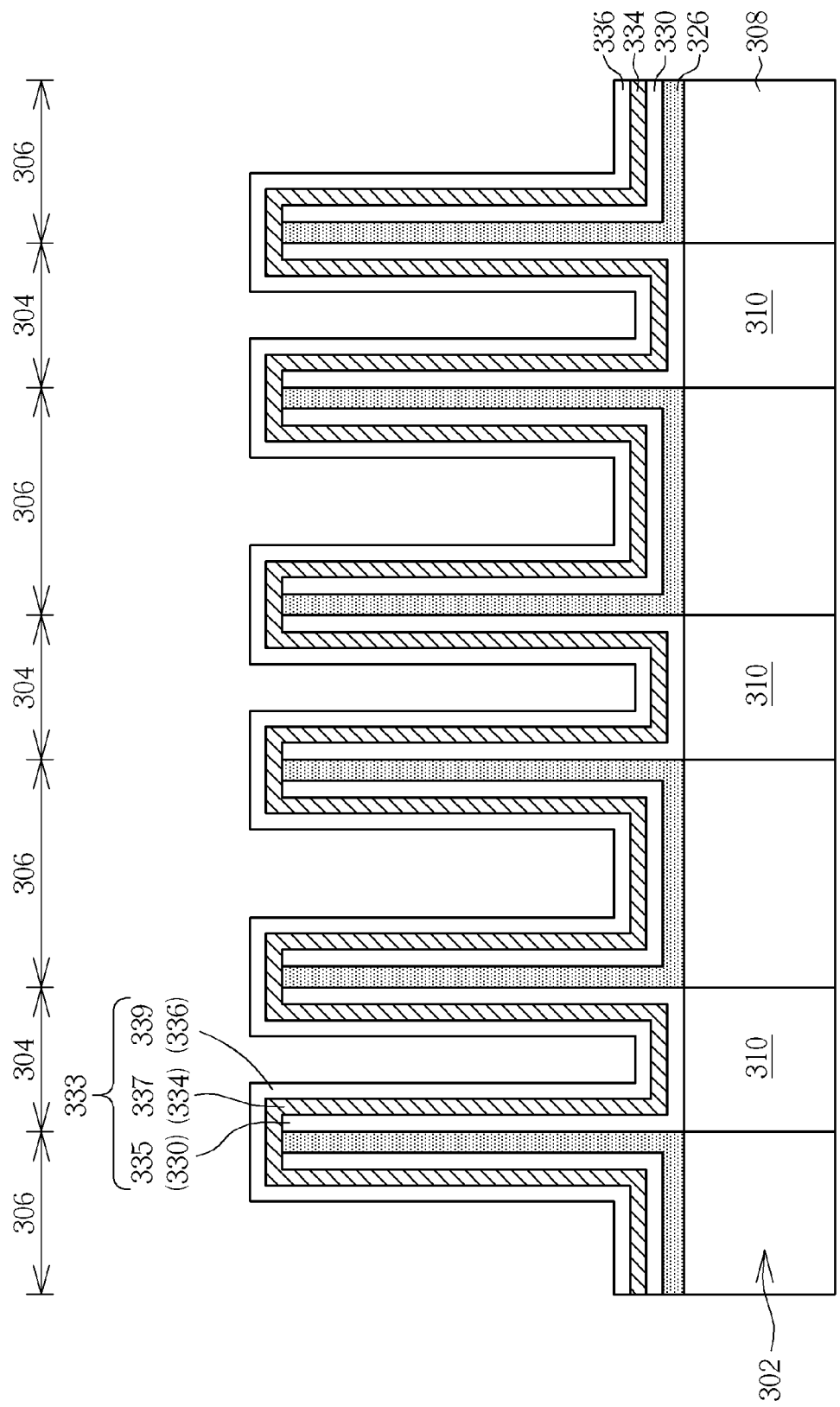

As shown in FIG. 11, after the third sacrificial layer 332 is removed, a dielectric layer 334 and a second conductive layer 336 are formed on the substrate 302 in sequence. The dielectric layer 334 is formed on the surface of the first conductive layer 330, and the second conductive layer 336 is formed on the surface of the dielectric layer 334. The first conductive layer 330, the dielectric layer 334, and the second conductive layer 336 located in each capacitor disposing region 304 constitute a capacitor structure 333, in which the first conductive layer 330 serves as the first capacitor electrode 335, the dielectric layer 334 serves as a capacitor dielectric layer 337, and the second conductive layer 336 serves as a second capacitor electrode 339. The dielectric layer 334 can be made of varieties of dielectric materials with high dielectric constants, such as hafnium silicate (HfSiO), hafnium silicon oxynitride (HfSiON), hafnium dioxide (HfO), lanthanum oxide (La2O3), lanthanum aluminate (LaAlO3), zirconium oxide (ZrO), zirconium silicate (ZrSiO) or hafnium zirconium oxide (HfZrO), etc., but is not limited thereto. The second conductive layer 336 can be made of varieties of conductive materials, such as titanium, gold, silver, copper, aluminum, molybdenum, tantalum, cadmium, nitride thereof, oxide thereof, alloys thereof or compounds thereof.

Figure 12:
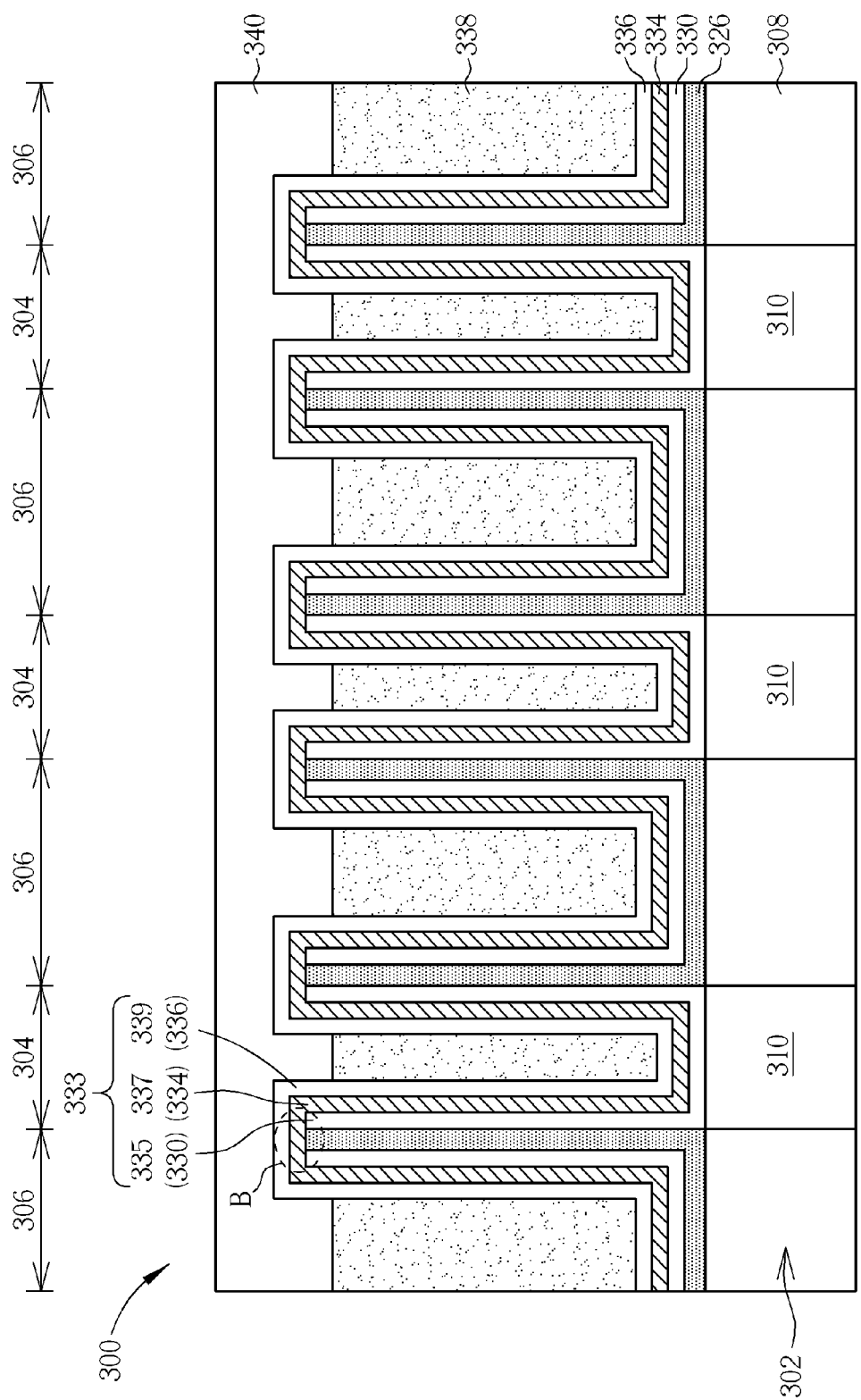

As shown in FIG. 12, a low-k dielectric layer 338 and a metal layer 340 are formed throughout the substrate 302. A preferred thickness of the low-k dielectric layer 338 is substantially smaller than the height of the second conductive layer 336, so that the metal layer 340 can be electrically connected to the second conductive layer 336. The low-k dielectric layer 338 can be made of undoped silicate glass, borophosilicate glass, fluorine-doped silicate glass, hydrogen silsesquioxane (Si:OH), methyl silsesquioxane (SiO:CH₃), hydropolysilsesquioxane, methyl polysilsesquioxane or phenyl polysilsesquioxane, but is not limited thereto. The metal layer 340 can be made of varieties of conductive materials, such as titanium, gold, silver, copper, aluminum, molybdenum, tantalum, cadmium, nitride thereof, oxide thereof, alloys thereof or compounds thereof. Thus, the storage capacitor 300 of the present invention is completed.

It can be seen from the aforementioned descriptions that a capacitor structure and a fabrication method thereof are provided in the present invention. The storage capacitor of the present invention has particular supporting structure, and therefore is not only disposed on the exterior surface of each capacitor structure, but also entirely supports sidewalls of each capacitor structure. Thus, the product yield of the storage capacitor can be promoted. In accordance with an embodiment, the supporting structure includes a carbon layer with electrical neutrality, which provides preferable supporting strength. In accordance with another embodiment, the low-k dielectric layer disposed in the storage capacitor can reduce the capacitive coupling effect between the metal layer and the capacitor structure. Additionally, according to conventional method of fabricating storage capacitor, a plurality of concavities are formed in advance, and then the capacitor structures are formed in the concavities. In the present invention, a plurality of sacrificial cylinders are formed in advance, and then the supporting structure and the capacitor structures are formed by utilizing the sacrificial cylinders. The sacrificial cylinders are formed by a negative photoresist layer with a mask (please refer to FIG. 4), which is the same as the prior art, and therefore needs not to be replaced.

Those skilled in the art will readily observe that numerous modifications and alterations of the device and method may be made while retaining the teachings of the invention.

What is claimed is:

1. A fabrication method of the capacitor structure, comprising:
    providing a substrate, comprising at least one capacitor disposing region defined thereon, wherein a supporting region is defined on a portion of the substrate where no capacitor disposing region is located;
    forming a first sacrificial layer on the substrate;
    removing the first sacrificial layer located in the supporting region, so that the first sacrificial layer located in each capacitor disposing region forms a sacrificial cylinder;
    forming a supporting layer conformally on the surface of the substrate and each said sacrificial cylinder;
    forming a second sacrificial layer on the supporting layer;
    removing each said sacrificial cylinder, the supporting layer on the sacrificial cylinder and the second sacrificial layer on the supporting layer, so that the supporting layer forms a supporting structure on the substrate, wherein the supporting structure comprises at least one vertical hollow cylinder and a horizontal supporting layer connected to the vertical hollow cylinder; and
    forming a capacitor structure on the interior surface of a vertical hollow cylinder.

2. The fabrication method of the capacitor structure according to claim 1, wherein a method of forming the sacrificial cylinder comprises:
    forming a shielding layer and a patterned photoresist layer on the first sacrificial layer, wherein the patterned photoresist layer comprises negative photoresist material; and
    etching the first sacrificial layer to form the sacrificial cylinder by using the patterned photoresist layer as a mask.

3. The fabrication method of the capacitor structure according to claim 1, wherein a method of forming the supporting structure in the supporting region comprises:
    forming a material layer on the substrate, wherein the material layer is formed on the surface of the sacrificial cylinder and the substrate within the supporting region; and
    removing the material layer located in each capacitor disposing region to form the supporting structure.

4. The fabrication method of the capacitor structure according to claim 1, wherein a method of removing the material layer located in each capacitor disposing region comprises:
    performing a planarization process to remove at least the material layer located in each capacitor disposing region; and
    removing the second sacrificial layer.

5. The fabrication method of the capacitor structure according to claim 1, wherein the supporting structure comprises a carbon layer.

6. The fabrication method of the capacitor structure according to claim 1, wherein a method of forming the capacitor structure comprises:
    forming a first conductive layer throughout the whole substrate, wherein the first conductive layer is formed on the surface of the supporting structure and the substrate within each capacitor disposing region;
    removing the first conductive layer located on intersectional regions between each capacitor disposing region and the supporting region;

forming a capacitor dielectric layer on the surface of the first conductive layer; and forming a second conductive layer on the surface of the capacitor dielectric layer, wherein the first conductive layer, the capacitor dielectric layer, and the second conductive layer disposed in the vertical hollow cylinder constitute the capacitor structure.

7. The fabrication method of the capacitor structure according to claim 6, wherein a method of removing the first conductive layer located on the intersectional regions between each capacitor disposing region and the supporting region comprises:

forming a third sacrificial layer in the supporting region and the supporting region;

performing a planarization process to remove the first conductive layer located on the intersectional regions between each capacitor disposing region and the supporting region; and removing the third sacrificial layer.

8. The fabrication method of the capacitor structure according to claim 1, wherein after the capacitor structure is formed, the fabrication method further comprises:

forming a dielectric layer on the substrate; and forming a metal layer on the dielectric layer, wherein the metal layer is electrically connected to the capacitor structure.

9. The fabrication method of the capacitor structure according to claim 8, wherein the dielectric layer includes undoped silicate glass, borophosphosilicate glass, fluorine-doped silicate glass, hydrogen silsesquioxane (Si:OH), methyl silsesquioxane (SiO:CH3), hydropolysilsesquioxane, methyl polysilsesquioxane or phenyl polysilsesquioxane.

* * * * *